(12) United States Patent
Pierce

(10) Patent No.: US 6,524,885 B2
(45) Date of Patent: Feb. 25, 2003

(54) METHOD, APPARATUS AND SYSTEM FOR BUILDING AN INTERPOSER ONTO A SEMICONDUCTOR WAFER USING LASER TECHNIQUES

(75) Inventor: John L. Pierce, Dallas, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 15 days.

(21) Appl. No.: 09/738,228

(22) Filed: Dec. 15, 2000

(65) Prior Publication Data

US 2002/0076855 A1 Jun. 20, 2002

(51) Int. Cl.[7] .................. H01L 21/44; H01L 21/48; H01L 21/50
(52) U.S. Cl. .................. 438/106; 438/118; 438/120; 438/113; 438/119
(58) Field of Search ............. 438/106, 118, 438/120, 113, 119, 612, 613

(56) References Cited

U.S. PATENT DOCUMENTS 6,197,613 B1 * 3/2001 Kung et al. .............. 438/106
6,388,335 B1 * 5/2002 Lam ......................... 257/778
6,392,428 B1 * 5/2002 Kline et al. ................ 324/755
6,440,771 B1 * 8/2002 Pierce ........................ 438/106

* cited by examiner

Primary Examiner—David Nelms
Assistant Examiner—Andy Huynh
(74) Attorney, Agent, or Firm—Lawrence R. Youst; Danamraj & Youst, P.C.

(57) ABSTRACT

The present invention provides a method, apparatus and system for building a wafer-interposer assembly. The method includes the steps of forming a redistribution layer (RDL) pad on a semiconductor wafer. The semiconductor wafer has a semiconductor die and the RDL pad has an electrical connection to the semiconductor die. A layer of epoxy is placed on the semiconductor wafer and on the RDL pad. The epoxy is then leveled generally parallel to the surface of the semiconductor wafer and removed from a portion of the RDL pad. An interposer pad is formed on the RDL pad where the epoxy was removed.

11 Claims, 2 Drawing Sheets

METHOD, APPARATUS AND SYSTEM FOR BUILDING AN INTERPOSER ONTO A SEMICONDUCTOR WAFER USING LASER TECHNIQUES

FIELD OF THE INVENTION

The present invention relates generally to the field of integrated circuits, and more particularly, to a method, apparatus and system for building an interposer onto a wafer using laser techniques.

BACKGROUND OF THE INVENTION

Without limiting the scope of the invention, this background of the present invention will be described with reference to building a semiconductor wafer-interposer, as an example. After the introduction of the integrated circuit, engineers have worked diligently to produce electronic devices that are smaller and more functional than the previous versions of the devices. Advances in manufacturing techniques allow more components to be integrated into a smaller semiconductor die. More components within the die enable engineers to design devices having greater efficiency and more convenient functions. However, increasing the number of components within the die can adversely affect the size and manufacturing costs of the device.

Each new device design often requires smaller, more efficient semiconductor packages to perform advanced functions and consume less power and space. Die size and number of contact pads influence the size of a semiconductor package. More components within the die require more contact pads, which facilitate electrical connections or interfaces between the die to other systems in the device. However, traditional connection techniques are not very space efficient.

Traditionally, die design was limited because all connections between the components of the die interfacing systems were through the peripheral edges of the chip (for wire bonding) or through a standard pin or pad layout defined by a standardization body, such as the Joint Electrical Dimensional Electronic Committee (JEDEC). The interconnection requirements, therefore, have traditionally driven the die layout.

Although space efficiency may be improved by using a semiconductor wafer-interposer, it is difficult to attached a separate interposer to a semiconductor wafer and maintain close dimensional tolerances. Close tolerance for package height is a requirement for many applications. Typically, thick packages are more reliable and have lower manufacturing costs. In contrast, thin packages may be required for applications where space and weight are at a premium. Additionally, manufacturing a thin package is usually costly because smaller components are more difficult to process and require more precise machinery.

Current manufacturing processes cannot precisely and efficiently control the final height of the package. After the wafer-interposer assembly is diced, the footprint of the resulting semiconductor package is almost the size of the die, which is as small as the package can be without making a smaller die. However, the height of the package cannot be as accurately controlled because it varies according to the method used to construct the wafer-interposer.

Another costly manufacturing process associated with assembling semiconductor packages having interposers is aligning the die with the interposer. The contact pads on the die and the interposer must be aligned and connected to result in a functional semiconductor package. Aligning minute contacts between the die and the interposer is an expensive and time intensive process. Currently available methods of alignment slow the manufacturing process and increase costs.

Accordingly, there is a need for a system, method and apparatus for building a semiconductor wafer-interposer assembly that overcomes the present manufacturing limitations and inefficiencies.

SUMMARY OF THE INVENTION

The present invention provides a method, apparatus and system for building a wafer-interposer assembly. The method includes the steps of forming a redistribution layer (RDL) pad on a semiconductor wafer. The semiconductor wafer has a semiconductor die and the RDL pad has an electrical connection to the semiconductor die. A layer of epoxy is placed on the semiconductor wafer and on the RDL pads. The epoxy is then leveled generally parallel to the surface of the semiconductor wafer and removed from a portion of the RDL pad. An interposer pad is formed on the RDL pad where the epoxy was removed.

The present invention also provides an apparatus for building a wafer-interposer assembly that includes a wafer holder and a laser. A controller operates the laser relative to the wafer to precisely remove epoxy from the wafer. The laser levels the epoxy and removes epoxy from components of the wafer.

In addition, the present invention provides a system for building a wafer-interposer assembly that includes a device to place a layer of epoxy on a surface of a wafer. The surface of the wafer has a die, which is electrically connected to a die pad. The die pad is electrically connected to a redistribution layer (RDL) pad. The system also includes a laser, a wafer holder, and a controller. The controller orients the laser and the wafer and operates the laser to precisely remove a portion of the epoxy from the wafer.

Other features and advantages of the present invention shall be apparent to those of ordinary skill in the art upon reference to the following detailed description taken in conjunction with the accompanying drawings.

BRIEF DESCRIPTION OF THE DRAWINGS

The above and further advantages of the invention may be better understood by referring to the following description in conjunction with the accompanying drawings in which corresponding numerals in the different figures refer to corresponding parts and in which.

DETAILED DESCRIPTION

Although making and using various embodiments of the present invention are discussed herein in terms of using laser techniques to build an interposer onto a wafer, it should be appreciated that the present invention provides many applicable inventive concepts that can be embodied in a wide variety of specific contexts. The specific embodiments discussed herein are merely illustrative of specific ways to make and use the invention and do not limit the scope of the invention.

Interposers allow greater freedom to die designers because the layout of a die and its contact pads can be defined according to the interaction of the functional elements of the die rather than according to the standardization requirements. The interposer can be designed with a standardized layout of contact pads on its upper surface and can electrically connect each die pad to a corresponding interposer contact pad without an interposer pad being directly above its corresponding die pad. Not only does the interposer provide for standardized interconnection, it also provides for the use of standard test hardware, software, cabling and connectors compatible with existing industry infrastructure.

An additional advantage of the interposer is that more than one interposer can be designed for each wafer. A manufacturer can then, by substituting a different interposer, modify the layout of the interposer pads to conform to a different layout or packaging standard. Alternatively, if the die and interposer are designed for modularity, a single interposer design may be useful on more than one chip design. A specific interposer design will typically be necessary for each unique die design.

Figure 1A:
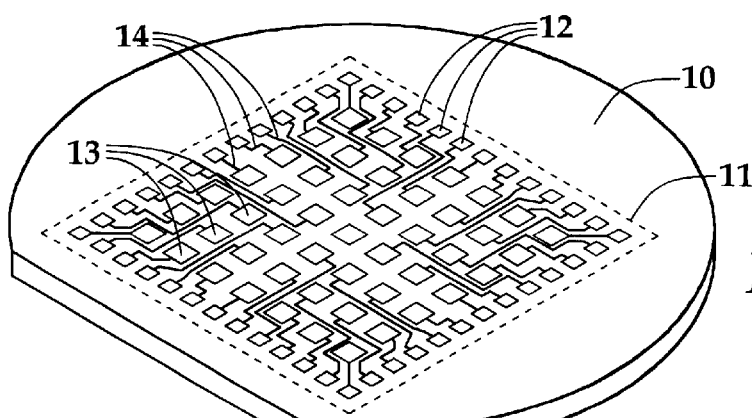
FIG. 1 is a perspective view of a semiconductor wafer in accordance with certain embodiments of the present invention.
Figure 1B:

FIG. 1 depicts a wafer 10 having a die 11, which may have many circuits within its structure. The wafer 10 may have several identical or different dice 11, which eventually may be separated or diced into individual semiconductor chips. One or more die pads 12 electrically contact the circuits within die 11. An underbump metalization may be deposited onto the die pads 12. A redistribution layer (RDL) may then be deposited onto the wafer 10. One or more known semiconductor processes, such as photolithography or etching for example, may be used to process the RDL into RDL pads 13. The RDL pads 13 may then be connected to the die pads 12 by connectors 14. The RDL pads 13 provide an interface between the circuits of the die 11 and an interposer. Each of the die pads 12 corresponds to a particular RDL pad 13.

The RDL pads 13 may be a material that is reflective to laser frequencies to facilitate subsequent processes of the present invention. The RDL pads 13 may also be made from a material that is compatible with solder or conductive polymer. Copper, for example, may be one suitable material for the RDL pads 13. Other materials that are electrically conductive and compatible with solder or conductive polymers may also be used for the RDL pads 13 and will be apparent to those having ordinary skill in the art.

The layout and size of the RDL pads 13 may have the same configuration as the pad configuration of a finished semiconductor package. Designing the configuration of the RDL pads 13 to match the requirements of the finished package increases manufacturing efficiency. Multiple, identical dice 11 may be efficiently produced in large quantities and used in a variety of different applications by simply changing the configuration of the RDL pads 13. Efficiency increases because the same die 11 may be used for multiple applications that require different semiconductor package configurations.

Figure 2:
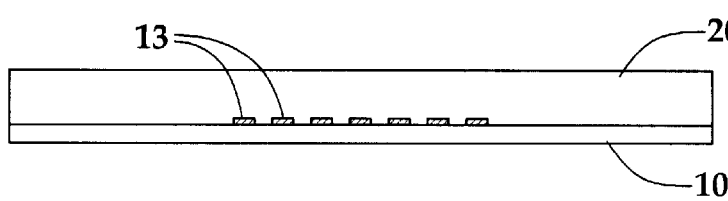
FIG. 2 is a cross-sectional view of a wafer-interposer assembly in accordance with certain embodiments of the present invention.

Next, the wafer 10 is coated with a layer of epoxy 20 as depicted in FIG. 2. The epoxy 20 may be applied using any of many semiconductor chip manufacturing techniques known in the art. Spraying, rolling or vapor deposition, for example, is used to apply the epoxy 20 to the wafer 10. The epoxy 20 may be non-conductive and has a coefficient of thermal expansion similar to the wafer 10. The epoxy 20 may also be able to withstand the heat required to re-flow solder or other conductive material that is applied to the wafer 10 in subsequent processes. An epoxy material suitable for underfill, for example, may be used.

The epoxy 20 should be applied or deposited to a height that exceeds the upper surface of the RDL pads 13 by at least the diameter of the RDL pads 13. The epoxy 20 is then cured as required by the particular properties of the epoxy 20. Some curing methods may include infrared heat or chemical processes, for example. The cured epoxy 20 may have a relatively rough or undulating surface. However, a desirable minimum thickness is one that extends past the upper surface of the RDL pads 13 by approximately the diameter of the RDL pads 13.

Figure 3A:
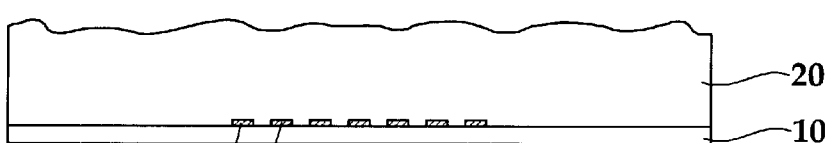
FIG. 3A is a cross-sectional view of a wafer-interposer assembly in accordance with certain embodiments of the present invention.
Figure 3B:
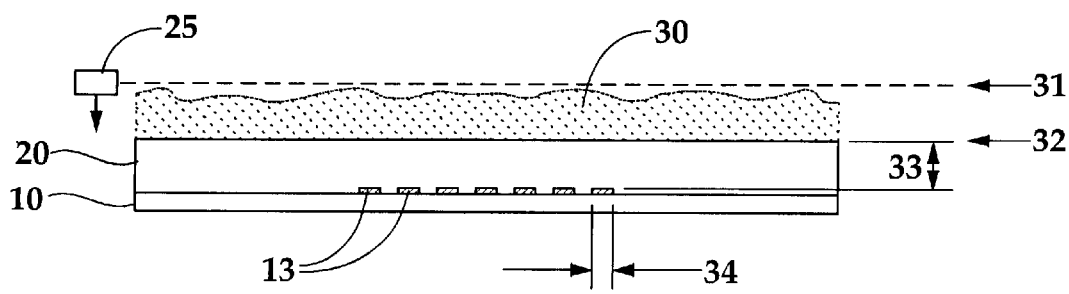
FIG. 3B is a cross-sectional view of a wafer-interposer assembly in accordance with certain embodiments of the present invention.

FIGS. 3A and 3B depict a trimming process that may vaporize the top of the epoxy 20 to achieve a very flat surface and controlled height. An exaggerated surface of the epoxy 20 is shown in FIG. 3A. The thinnest point of the epoxy 20 should be approximately at least as thick as the diameter 34 of the RDL pad 13 plus the height of the RDL pad 13.

A controller (not shown) may be used to operate a laser 25 to vaporize selected areas of the epoxy 20. The controller, for example, may be the type of controller utilized for computer-numerical-control (CNC) machining, which maneuvers and operates a tool in three dimensions. In this particular application, the controller maneuvers the laser 25 about the wafer 10 and selectively vaporizes portions of the epoxy 20. The process of removing the epoxy 20 will be described in further detail below.

In FIG. 3B, the laser 25 may be aimed at initial elevation 31 and generally parallel to the surface of the wafer 10. This initial elevation 31 of the laser 25 may be slightly above the highest point of the epoxy 30. The controller begins sweeping the laser 25 across the wafer 10 and slowly lowers the laser 25 through excess epoxy 30 to final elevation 32. As it is lowered, the laser 25 impinges on high points of the surface of the epoxy 20 and vaporizes the excess epoxy 30 as the laser 25 sweeps across the entire wafer 10. The elevation 32 is at a point where the distance 33 between the surface of the epoxy 20 and the surface of the RDL pads 13 is approximately the diameter 34 of the RDL pads 13. The distance 33 may be varied to optimize the aspect ratio for conductor screening, which will be described below.

Figure 4:
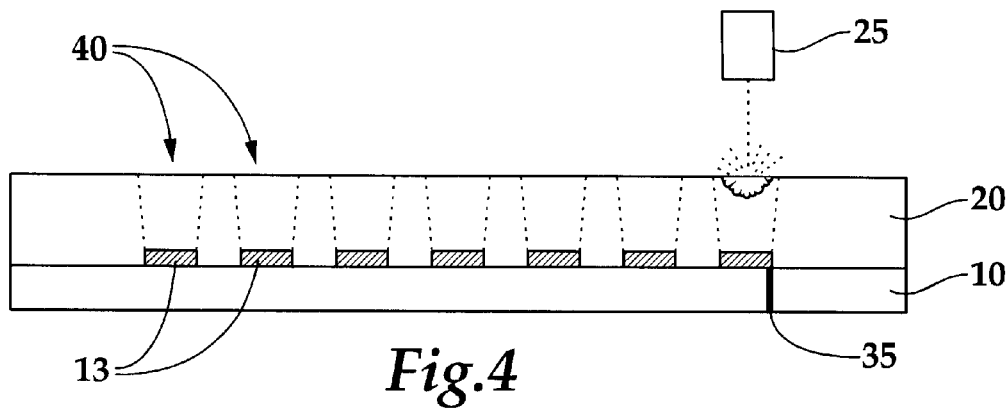
FIG. 4 is a cross-sectional view of a wafer-interposer assembly in accordance with certain embodiments of the present invention.

The laser 25 may also be used to create openings 40 in the epoxy 20 as depicted in FIG. 4. The laser 25 is first oriented to the wafer 10 using alignment marks 35 on the wafer 10. If the alignment marks 35 have been covered during the epoxy coating process, a rough alignment can be made using a flat spot or other reference point on the wafer 10. Next, the laser 25 may be used to etch away the epoxy 20 around the alignment marks 35. After the alignment marks 35 are located, the location of RDL pads 13 can be very accurately determined by using the alignment marks 35 in conjunction with a coordinate map of the RDL pads 13. The laser 25 creates the openings 40 by vaporizing the epoxy 30. The laser 25 vaporizes the epoxy 20 down to the surface of the RDL pads 13 but does not affect the RDL pads 13 because of the reflective properties of the RDL pads 13.

This process is similar to using the laser 25 as a drill. The controller determines drilling locations, which are generally above the RDL pads 13, by moving the laser 25 relative to the alignment marks 35. The laser 25 may then be activated to vaporize the epoxy 30 and "drill" the openings 40. The RDL pads 13 act as "drill stops" because the RDL pads 13 reflect the laser 25 instead of being vaporized by the laser 25.

Figure 5:
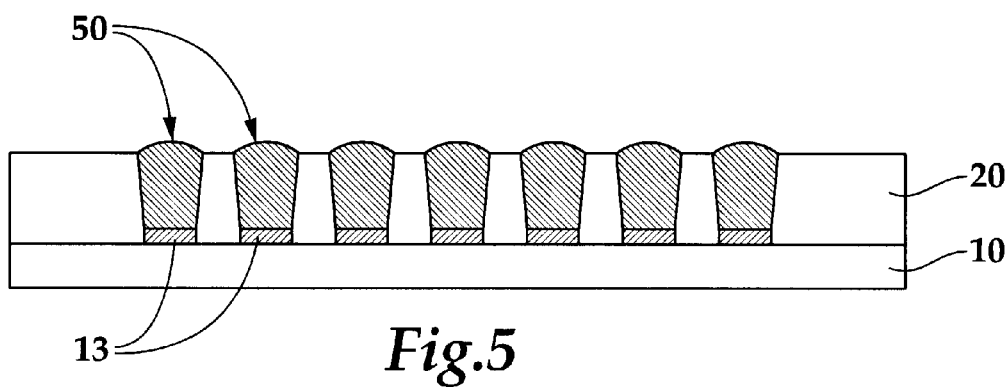
FIG. 5 is a cross-sectional view of a wafer-interposer assembly in accordance with certain embodiments of the present invention.

FIG. 5 shows the openings 40 filled with a conductive material by screening, for example, to form interposer pads 50. The aspect ratio of the openings 40 may be adjusted so that the conductive material easily flows into the openings 40 and adequately fills the openings without leaving any voids. Also, the aspect ratio facilitates the conductive material filling the openings 40 and contacting the RDL pads 13. The conductive material may be solder, conductive polymer or any other suitable material and may be screened into the openings 40. The conductive material forms a permanent and reliable electrical connection to RDL pads 13. After screening into the openings 40, the conductive material is re-flowed or cured. After re-flowing or curing, the wafer-interposer is at minimum thickness. If a thicker package is required or if it is desirable to protect the backside of the die 11, then an epoxy coat can be applied to the back of the wafer 10.

The interposer pads 50 may be used as contacts for testing and burn-in of the wafer 10. The interposer pads 50 may also be used to connect and attach the resulting device to a printed circuit board or other structure after the interposer is diced into individual circuits.

Figure 6:
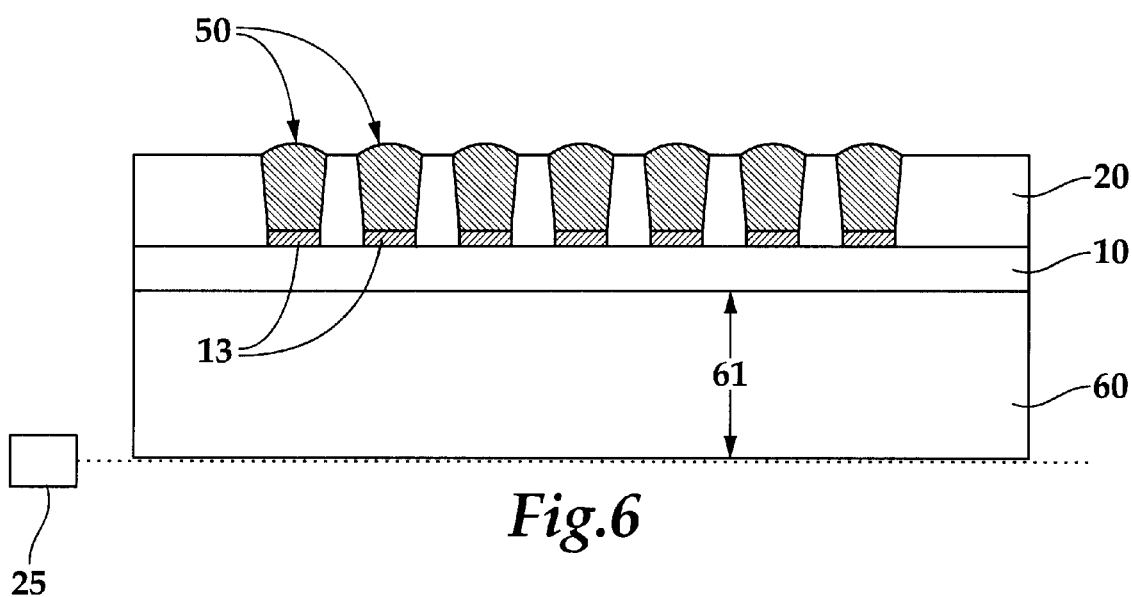
FIG. 6 is a cross-sectional view of a wafer-interposer assembly in accordance with certain embodiments of the present invention.

FIG. 6 depicts the wafer-interposer having an additional layer of epoxy 60, which may be added to the backside of the wafer 10. The technique for applying the epoxy 60, the composition of the epoxy 60 and the method for creating a dimensionally precise surface is similar to the process for the front side of the wafer 10, which has been described above. The thickness 61 of the wafer-interposer may be adjusted by removing and leveling the epoxy 60 using the laser 25. Because there are no electrical contacts oil the backside of the wafer 10, the thickness 61 may be adjusted without concern for maintaining a particular aspect ratio. After construction of the wafer-interposer is complete, testing and burn-in may be performed while all circuits are in wafer form. After final testing, the wafer-interposer may be diced into individual components.

While specific alternatives to steps of the invention have been described herein, additional alternatives not specifically disclosed but known in the art are intended to fall within the scope of the invention. Thus, it is understood that other applications of the present invention will be apparent to those skilled in the art upon the reading of the described embodiment and a consideration of the appended claims and drawings.

What is claimed is:

1. A method for building a wafer-interposer assembly comprising the steps of:

forming one or more redistribution layer (RDL) pads on a semiconductor wafer, the semiconductor wafer including one or more semiconductor die, the RDL pads having an electrical connection to the semiconductor die;

placing a layer of epoxy on a surface of the semiconductor wafer and the one or more RDL pads;

leveling the epoxy layer using a laser such that the epoxy layer is generally parallel to the surface of the semiconductor wafer;

removing the epoxy from a portion of the one or more RDL pads; and forming an interposer pad on the RDL pad.

2. The method as recited in claim 1 wherein the step of removing the epoxy is by a laser.

3. The method as recited in claim 1 further comprising the step of increasing the thickness of the wafer-interposer assembly by placing a second layer of epoxy on an opposite surface of the semiconductor wafer.

4. The method as recited in claim 1 further comprising the step of singulating each wafer-interposer assembly into two or more chip assemblies.

5. The method as recited in claim 1 further comprising the step of aligning the laser with the wafer using an alignment mark.

6. The method as recited in claim 1 further comprising the step of testing each semiconductor die through the interposer pad.

7. The method as recited in claim 6 further comprises the step of burning-in each semiconductor die through the interposer pad.

8. The method as recited in claim 6 further comprising the step of grading each semiconductor die during testing and sorting the semiconductor die based upon performance level.

9. The method as recited in claim 6 further comprising the step of grading each of the semiconductor chips during testing and sorting the semiconductor chips into conforming and non-conforming groups.

10. The method as recited in claim 6 wherein the step of testing each semiconductor die further comprises heating the semiconductor wafers to thermally stress the semiconductor die.

11. The method as recited in claim 6 wherein the step of testing each semiconductor die further comprises vibrating the semiconductor wafers to mechanically stress the semiconductor die.

* * * * *